(12) United States Patent
Mori et al.

(10) Patent No.: US 9,171,714 B2
(45) Date of Patent: *Oct. 27, 2015

(54) INTEGRATED PROCESSING OF POROUS DIELECTRIC, POLYMER-COATED SUBSTRATES AND EPOXY WITHIN A MULTI-CHAMBER VACUUM SYSTEM CONFIRMATION

(71) Applicant: APPLIED MATERIALS, Inc., Santa Clara, CA (US)

(72) Inventors: Glen T. Mori, Gilroy, CA (US); Yueh Sheng Ow, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 182 days.

This patent is subject to a terminal disclaimer.

(21) Appl. No.: 13/960,236

(22) Filed: Aug. 6, 2013

(65) Prior Publication Data

US 2014/0068962 A1 Mar. 13, 2014

Related U.S. Application Data

(60) Provisional application No. 61/698,386, filed on Sep. 7, 2012.

(51) Int. Cl.
*F26B 21/00* (2006.01)
*H01L 21/02* (2006.01)
(Continued)

(52) U.S. Cl.
CPC ...... *H01L 21/0206* (2013.01); *H01L 21/31058* (2013.01); *H01L 21/67115* (2013.01);
(Continued)

(58) Field of Classification Search
CPC .......... F26B 19/00; F26B 21/00; F26B 21/06; H01G 21/00; H01G 21/02; H05B 6/66
USPC ......... 34/259, 275, 380, 381, 497, 77, 78, 80; 118/712; 438/781; 219/696, 702
See application file for complete search history.

(56) References Cited

U.S. PATENT DOCUMENTS 5,106,787 A 4/1992 Yen
5,191,182 A * 3/1993 Gelorme et al. ............. 219/696
(Continued)

FOREIGN PATENT DOCUMENTS

JP H10-312976 A 11/1998
KR 1999-0033654 A 5/1999
(Continued)

OTHER PUBLICATIONS

International Search Report received dated Nov. 19, 2013 for related application PCT/US2013/0538300.

*Primary Examiner* — Stephen M Gravini
(74) *Attorney, Agent, or Firm* — Patterson & Sheridan, LLP (57) ABSTRACT

Methods and apparatus for processing a substrate are described herein. A vacuum multi-chamber deposition tool can include a degas chamber with both a heating mechanism and a variable frequency microwave source. A method for degassing a substrate can include positioning a substrate comprising a polymer or an epoxy within a processing chamber maintained between a degas temperature and a glass transition temperature, exposing the substrate to variable frequency microwave radiation, exposing the substrate to a plasma comprising an inert gas, removing oxygen containing compounds from the chamber, raising the pressure of inert gas in the chamber, and maintaining the pressure of inert gas while cooling the substrate to a temperature lower than the degas temperature.

10 Claims, 4 Drawing Sheets

(51) Int. Cl.
  *H01L 21/768* (2006.01)
  *H01L 23/00* (2006.01)
  *H01L 21/3105* (2006.01)
  *H01L 21/67* (2006.01)

(52) U.S. Cl.
  CPC .... *H01L21/67184* (2013.01); *H01L 21/67207* (2013.01); *H01L 21/76826* (2013.01); *H01L 21/76828* (2013.01); *H01L 23/00* (2013.01)

(56) References Cited

U.S. PATENT DOCUMENTS

| | | | |
|---|---|---|---|
| 5,730,801 A | 3/1998 | Tepman et al. | |
| 6,150,645 A * | 11/2000 | Lewis et al. | 219/715 |
| 6,251,759 B1 | 6/2001 | Guo et al. | |
| 6,379,994 B1 * | 4/2002 | Sano et al. | 438/96 |
| 6,841,201 B2 | 1/2005 | Shanov et al. | |
| 6,949,450 B2 | 9/2005 | Chiang et al. | |
| 7,030,023 B2 | 4/2006 | Pan et al. | |
| 2003/0026917 A1 * | 2/2003 | Lin et al. | 427/453 |
| 2005/0230344 A1 | 10/2005 | Koschinsky et al. | |
| 2007/0095823 A1 * | 5/2007 | Sedlmayr | 219/688 |
| 2007/0167029 A1 * | 7/2007 | Kowalski et al. | 438/769 |
| 2009/0134152 A1 * | 5/2009 | Sedlmayr | 219/687 |
| 2009/0184399 A1 * | 7/2009 | Kowalski et al. | 257/618 |
| 2009/0298279 A1 | 12/2009 | Feustel et al. | |
| 2012/0086107 A1 * | 4/2012 | Yamamoto et al. | 257/632 |
| 2013/0075390 A1 * | 3/2013 | Ashida | 219/702 |
| 2014/0068962 A1 * | 3/2014 | Mori et al. | 34/265 |
| 2015/0056819 A1 * | 2/2015 | Wong et al. | 438/781 |

FOREIGN PATENT DOCUMENTS

| | | |
|---|---|---|
| KR | 2001-0039860 A | 5/2001 |
| KR | 2012-0090996 A | 8/2012 |

* cited by examiner

INTEGRATED PROCESSING OF POROUS DIELECTRIC, POLYMER-COATED SUBSTRATES AND EPOXY WITHIN A MULTI-CHAMBER VACUUM SYSTEM CONFIRMATION

CROSS-REFERENCE TO RELATED APPLICATIONS

This application claims benefit of U.S. Provisional Patent Application Ser. No. 61/698,386, filed Sep. 7, 2012, which is herein incorporated by reference.

BACKGROUND OF THE INVENTION

1. Field of the Invention

Embodiments of the present invention generally relate to apparatus and methods for substrate processing using microwave radiation.

2. Description of the Related Art

To match the constant demand for smaller and more powerful devices, the size of integrated components on semiconductors is decreasing. As features on semiconductor devices become smaller, advanced polymers and dielectrics have been developed to allow features to become more compact. These new dielectrics and polymers employ increased porosity to provide characteristics consistent with decreasing size and increasing compactness.

Deposition of high-quality metal films requires clean surfaces free of residues and desorption of volatile materials. It is common practice in semiconductor fabrication and packaging to use a thermal degas process often followed by a cleaning prior to metal deposition. These processes are typically carried out in-situ (without air exposure prior to metal deposition) to avoid recontamination of the substrate and incoming films. The thermal degas process typically involves heating the substrate on a hot plate, in a convection oven or using infrared heating by a lamp array.

Degassing has previously been done by heating of the substrate, with either a heating plate or infrared (IR) radiation lamps. However, both of these thermal heating embodiments are not sufficient in degassing modern films. Thermal heating takes quite a long time and results in very low productivity of the tools. Further, standard thermal processing can easily bring modern films to a temperature which produces oxygen-containing secondary gases or leads to glass transition of the layer.

Thus, there is a need in the art for methods and apparatus which allow for efficient degassing of the film while maintaining heat with the thermal processing ranges of the deposited film.

SUMMARY OF THE INVENTION

In one embodiment, a vacuum multi chamber deposition tool can include a degas chamber which can include a chamber body, a substrate support configured to support a substrate having a selected diameter, a heating mechanism configured to heat the substrate, temperature measuring device, and a variable frequency microwave radiation source configured to deliver microwave radiation of varying frequency toward the surface of the substrate support; and a pre-metallization clean chamber.

In another embodiment, a method for degassing a substrate can include positioning a substrate comprising a polymer or an epoxy within a processing chamber, wherein the chamber is maintained between a degas temperature and a glass transition temperature, flowing an inert gas into the chamber, creating a plasma comprising the inert gas, exposing the substrate to a plasma comprising the inert gas, removing oxygen containing compounds from the chamber, raising the pressure of inert gas in the chamber, and maintaining the pressure of inert gas while cooling the substrate to a temperature lower than the degas temperature.

In another embodiment, a method for degassing a substrate can include positioning a substrate comprising a polymer or an epoxy within a processing chamber, positioning a variable microwave radiation source to deliver microwave radiation to the substrate, delivering microwave radiation to the substrate at more than one frequency over short bursts of time while maintaining the temperature of the substrate at a temperature above the degas temperature, and removing a first set of oxygen containing compounds from the chamber.

In another embodiment, a vacuum multi-chamber deposition tool can include a load lock chamber; a first transfer chamber with a first central robot mounted therein; a second transfer chamber with a second central robot mounted therein; and a degas chamber including a chamber body, a substrate support configured to support a substrate having a selected diameter, a substrate heating mechanism configured to heat the substrate, a temperature measuring device and a variable frequency microwave radiation source using two or more frequencies selected from the range of 5.85 GHz to 7.0 GHz which vary by between 200 Hz and 280 Hz and configured to deliver the microwave radiation of varying frequency toward the surface of the substrate support; a pre-metallization clean chamber fluidly connected with the degas chamber and employing a sputtering clean process comprising an inert gas; and a deposition chamber fluidly connected with the pre-metallization clean chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods and apparatus for processing a substrate are described herein. A vacuum multi-chamber deposition tool can include a degas chamber with both a heating mechanism and a variable frequency microwave source. A method for degassing a substrate can include positioning a substrate comprising a polymer or an epoxy within a processing chamber maintained between a degas temperature and a glass transition temperature, exposing the substrate to variable frequency microwave radiation, exposing the substrate to a plasma comprising an inert gas, removing oxygen containing compounds from the chamber, raising the pressure of inert gas in the chamber, and maintaining the pressure of inert gas while cooling the substrate to a temperature lower than the degas temperature.

Semiconductor fabrication and packaging increasingly involves the use of porous dielectrics, epoxy and polymeric materials. For semiconductor device fabrication, these materials can be used as inter-metal dielectric films and final passivation films. For semiconductor packaging, these materials can be used as the substrate, as a bonding compound to join the device wafer to a carrier substrate, and as an underfill material for chip-on-wafer stacking and interconnect.

These dielectric, epoxy and polymer materials readily adsorb moisture upon exposure to air and often contain residual volatile materials which can outgas during subsequent metal deposition processes. Outgassing can result in poor quality metal films with poor adhesion, high resistance, and poor film morphology/properties among other issues. Thus, polymer and epoxy materials require more aggressive degassing prior to metal deposition.

In embodiments described below, Variable Frequency Microwave (VFM) has been employed to reduce both the time and temperature required for degas processing of a substrate prior to metallization. Further embodiments can include the use of an inert plasma to pre-release volatile by-products from the polymer/epoxy material prior to pre-metallization cleaning. Further embodiment can include the application of an inert gas to seal pores of the polymer/epoxy prior to pre-metallization cleaning. Embodiments of the present application can be better understood with reference to the figures below.

Figure 1:
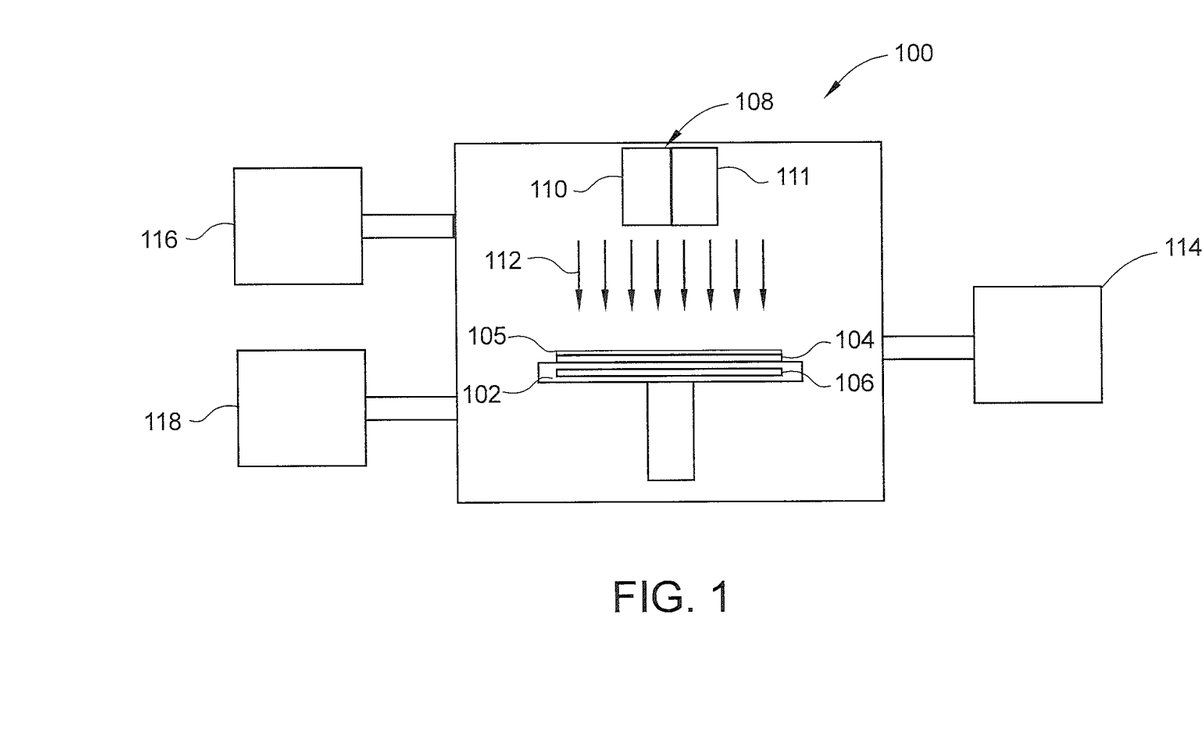
FIG. 1 is a schematic view of a degas chamber according to one embodiment.

FIG. 1 is a schematic view of a degas chamber 100 according to one embodiment. One or more currently available chambers can be adapted for embodiments of the invention described below. Chambers useable with embodiments of the present invention can include the Charger UBM system available from Applied Materials, Inc. located in Santa Clara, Calif. It is envisioned that other chambers, including chambers from other manufacturers, may be used in accordance with the described embodiments without diverging from the disclosed invention.

The degas chamber 100 can include a substrate support 102 for supporting a substrate 104. The substrate support 102 can be composed of standard materials, such as aluminum, quartz, ceramic or stainless steel. Further, the substrate support 102 can be designed to support substrates of any size, such as a 300 mm substrate. Various heating and cooling devices may be embedded in or positioned in connection with the substrate support 102 or the degas chamber 100 so as to delivered heating or cooling to the substrate 104.

The substrate 104 can be any composition useable for semiconductor applications, such as a silicon, epoxy or quartz substrate. The substrate 104 can have a polymer/epoxy layer 105 deposited thereon. The polymer/epoxy layer 105 can be a layer which is deposited onto a surface of the substrate 104 which is subsequently cured onto the substrate 104. Polymer/epoxy layer 105 can be formed by spin-coating a liquid polymer onto a substrate 104. The polymer/epoxy layer 105 can then be subjected to curing to solidify and cross-link the polymer/epoxy layer 105. The polymer/epoxy layer 105 may be composed of one of a number of polymers or epoxies, such as polyimides or Polybenzobisoxazole (PBO).

It is to be understood that other deposition techniques for depositing the polymer/epoxy layer may perform equally well, without diverging from the embodiments described herein. For example, it is envisioned that the polymer/epoxy layer 105 can be deposited using vacuum lamination of a dry polymer/epoxy film onto the substrate 104. Further embodiments can include deposition of the polymer/epoxy layer 105 by CVD.

The degas chamber 100 can also have a heat source 106, such as the heat source 106 depicted here as being embedded in the substrate support 102. Though the heat source 106 is depicted in FIG. 1 as being a resistive heat source embedded in the substrate support 102, the heat source 106 may be any heat source applicable to degassing of a substrate, such as an infrared heat lamp heat source. The heat from the heat source 106 may be delivered directly to the substrate 104 or indirectly by changing the temperature of the chamber. The heat source 106 can be designed to heat and maintain the substrate at a stable temperature, such as a temperature between 100° C. and 500° C. The heat source may be of any design and positioned in any position which will allow energy to be delivered for heating the substrate.

The degas chamber 100 may further include a variable frequency microwave radiation source 108. The variable frequency microwave radiation source 108 can include a microwave power source 110. The microwave power source 110 can be selected from all available microwave power sources, including magnetrons, klystrons, gyrotrons, and traveling wave tubes. The variable frequency microwave radiation source 108 can also include a microwave cavity 111. The microwave cavity 111 can be either a single mode, multi-mode cavity or combinations thereof. The microwave cavity 111 can receive power from the microwave power source 110.

The variable frequency microwave energy 112 can include continuous sweeping of frequencies over the available frequency range. Continuous sweeping can prevent charge buildup in metal layers, thus reducing the potential for arcing and subsequent damage. Frequency sweeping is often carried out by selecting a center frequency and then rapidly sweeping the frequency in a substantially continuous way over some range. Typically, frequency sweeping can include frequencies in the range of +/−5% of the center frequency, although this range can vary depending on such factors as the type of microwave source and the overall size of the cavity compared to the microwave wavelength.

The frequency range of the variable frequency microwave energy 112 can be a specific range of frequencies, such as a range from 5.85 GHz to 7.0 GHz. Further, the frequency range can be partitioned into frequencies of a specific interval from one another, such as frequencies selected to be separated by 200 Hz and 280 Hz. For example, a 260 Hz separation creating 4096 selected frequencies from which the variable frequency microwave energy 112 can be selected. Further, the variable frequency microwave energy 112 delivered during the frequency sweeping can be delivered to the substrate 104 in short bursts of each frequency range selected, such as short bursts of 20 microseconds to 30 microseconds per frequency, for example 25 microseconds.

The degas chamber 100 can further include a gas source 114. The gas source 114 can deliver an inert gas, such as a gas comprising argon or helium. The gas source 114 can deliver gas to the chamber at a specified flow rate based on the size of the chamber and the size of the substrate being processed. The gas source 114 can be directly connected with the chamber or indirectly delivered, such as a noble gas being converted to plasma in a remote plasma source prior to delivery to the chamber. The gas source 114 can be positioned so as to deliver gas over the substrate 104, so as to both cool the substrate 104 and to deliver the selected inert gas.

The degas chamber 100 can also include a plasma source 116. The plasma source 116 can produce plasma from an inert gas, such as from a gas including argon or helium. The plasma source 116 can produce the plasma inside the chamber or the plasma can be produced in a remote source. The plasma source 116 can receive gas flow from the gas source 114 or it may have a separate gas flow (not shown). The inert gas or combination including an inert gas used in the plasma source 116 need not be the same inert gas or combination including an inert gas that is used in the gas source 114. The plasma source 116 can use plasma formed by all available plasma production techniques, including inductively coupled plasma, capacitively coupled plasma or microwave plasma. The plasma source 116 can deliver plasma directed at the substrate 104 or generally to the degas chamber 100.

It is envisioned that embodiments described herein may be applicable to both curing and degassing the substrate 104 with a polymer/epoxy layer 105 in the degas chamber 100 without changing chambers. This would reduce adsorption of moisture from the atmosphere thus reducing the processing time required for degassing the substrate 104.

The degas chamber 100 can further include a vacuum source 118. The vacuum source 118 can be applied to both maintain a vacuum, such as during plasma processing, and to remove unwanted byproducts of the degassing, such as byproducts produced from the polymer/epoxy layer 105 during treatment with plasma. The byproducts, such as $C_xO_y$ and $C_xH_y$ gaseous byproducts, can affect further processing as they may be outgassed by the polymer/epoxy layer 105 during substrate processing, such as during a pre-metallization clean.

The degas chamber 100 can be fluidly connected to one or more related chamber, such as the pre-metallization clean chamber (not shown). The degas chamber 100 may also be part of a multi-chamber unit (not shown) which includes pre-metallization cleaning and deposition chambers. Using a fluid connection between chambers, especially after degassing, helps prevent further accumulation of $H_2O$ and other impurities.

It is important to note that, though embodiments described herein focus on a polymer/epoxy layer on a substrate, embodiments described herein are equally applicable to substrates which are formed substantially of polymers or epoxies which need to undergo degas procedures.

Figure 2:
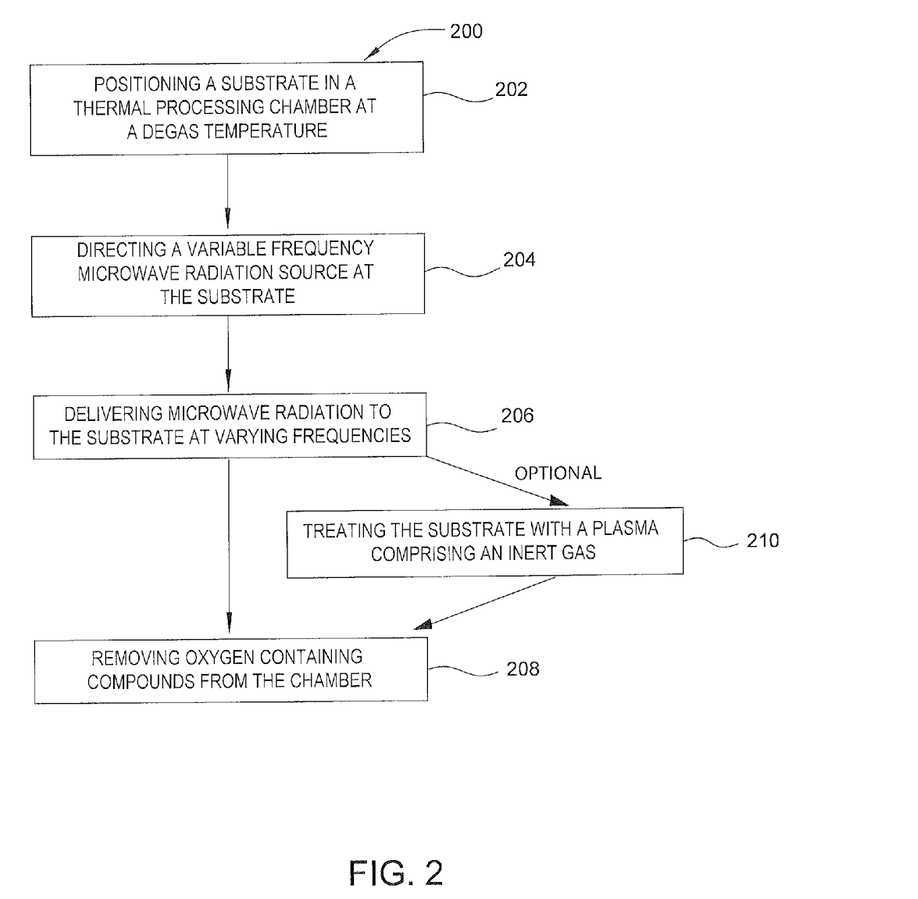
FIG. 2 is a block diagram of the method of degassing according to one embodiment.

FIG. 2 is a block diagram of the method 200 according to one embodiment. The method 200 can include positioning the substrate in a thermal processing chamber at a degas temperature, as in 202. The thermal processing chamber can be a processing chamber as described above. Further the thermal processing chamber may be part of a multi-chamber unit. The substrate is positioned on a substrate support with the temperature maintained at the degas temperature. The degas temperature can be specific to the material or at a standard temperature. Embodiments can include controlling temperature at the substrate alone or controlling temperature of the processing chamber to control substrate temperature indirectly.

Degassing is well known to be a useful component of the preparation for metallization of portions of a substrate. Among other factors, outgassing during metallization can cause contamination and high resistivity of deposited metal. It is primarily believed that $H_2O$ produces a significant portion of the deleterious effects avoided by degassing a substrate. Surface $H_2O$ is expected to degas at any temperature. Internal moisture will begin to degas at temperatures at or above 50° C. Thus, uniform heat with specific consideration of areas which are not exposed to the surface is important for proper degassing.

The method 200 can include directing a variable frequency microwave radiation source at the substrate, as in 204. The microwave radiation source can be of any design which allows for one or more wavelengths of microwave radiation to be delivered at a varying frequency to the substrate, which can include the embodiments described above. The microwave radiation source can be positioned so as to deliver microwave radiation to the substrate. Further the microwave radiation source may be at various angles with reference to the substrate position so long as the polymer/epoxy layer on the surface of the substrate receives at least portion of the microwave radiation.

It is believed that the microwave radiation will substantially reduce the degas time, but will need to be supplemented by direct heating. The dipole molecules are oscillated by the microwave energy. It is this oscillation which creates the internal heat which can be used to reduce $H_2O$ and other adsorbed molecule accumulation in the porous polymer material. As the degas continues, the dipole molecules upon which microwave heating relies, such as $H_2O$, will be escaping from the film. As such, the heating from the microwave radiation will decrease over time and will require supplementation from either direct heating or IR heating to complete the degas process.

The degas temperature does not necessarily represent standard degas temperatures as the degas process uses both microwave radiation and thermal processing to process the substrate. As such, the chamber temperature may be lower than the substrate localized temperature allowing for quicker cooling of the substrate after processing and avoidance of deleterious effects of overheating the polymer/epoxy layer.

The method 200 can further include delivering microwave radiation to the substrate at varying frequencies, as in 206. After directing the variable frequency microwave radiation source at the substrate, one or more wavelengths of microwave radiation can be delivered to the substrate at varying frequencies. The microwave radiation can be delivered at preselected frequencies of the specific wave length. The frequencies can be selected at random from a list of frequencies or can be chosen in a specific order. Certain materials may be less likely to accumulate energy based on the use of certain frequencies or certain combinations of frequencies. The accumulation of energy can be affected by both the frequencies applied and the wavelength of the microwave radiation used.

Without intending to be bound by theory, single frequency microwave radiation is inadequate for degassing of substrates prior to metallization. Single frequency microwave radiation can allow energy to accumulate in processed substrates, such as substrates with metal features. The use of a variable frequency microwave energy source can prevent the buildup of energy in the layers of a processed substrate. To prevent arcing within a device, such as a MOS device, and to promote uniform heating of the polymer/epoxy layer, a variable frequency microwave source may be employed.

Degassing a substrate to an appropriately low $H_2O$ content while maintaining the integrity of the device requires consideration of a number of factors. Degassing occurs at a specific temperature over a period of time. A higher temperature will reduce the amount of time necessary for degassing. However, since glass transition temperatures (Tg) of the polymer layer are comparatively low, Tg of the layer must be considered in the determination of a proper degas temperature. For example, polyimide film (PBO) is cured at 350° C. with a Tg of 375° C., thus the typical degas temperature is less than 350°

C. Next generation epoxy resins cure at about 200° C., and have a Tg of around 225° C., providing a maximum degas temperature of less than 200° C. Materials for further generations are expected to have cure temperature of about 110° C., and have a Tg of around 135° C., providing a maximum degas temperature of less than 110° C. By localizing the heating using microwave radiation, the time can be reduced and temperature can be strictly confined through uniform heating at the substrate alone.

The method 200 can further include removing oxygen containing compounds from the chamber, as in 208. During the degas process, compounds which are both accumulated during transfer in the atmosphere, such as $H_2O$, and compounds which are released during heating, such as $C_xO_y$ compounds from the polymer/epoxy layer, will accumulate in the processing area. These compounds can re-adsorb during a cool down process or they can interact with other available components, such as exposed metals. Embodiments of the present invention can employ a removal method, such as creating a vacuum or purging the chamber with an inert gas flow to remove these compounds from the chamber.

Once the substrate is has reached a sufficient reduction in $H_2O$ and the degassed compounds are removed from the degas chamber, the degassed substrate can be moved to a pre-metallization chamber for sputter or chemical etching to remove surface contaminants before metallization.

Optionally, the method 200 can include treating the substrate with a plasma comprising an inert gas, as in 210. The plasma treatment may be done in the degas chamber or in a separate chamber prior to the preclean and metal deposition chambers/events. Internal tests have demonstrated that exposure of some polymer materials to a high-density plasma, such as that used in the Isani XT sputter etch chamber available from Applied Materials, Inc. located in Santa Clara, Calif., can result in breakdown of the polymer structure and release of $C_xO_y$ and $C_xH_y$ gaseous by-products. In particular, the oxygen containing by-products can be poisonous to the pre-metallization clean process. By doing a plasma pre-treatment of the polymer in a separate chamber and prior to the pre-metallization clean, process poisoning may be avoided.

The optional plasma pre-treatment can be performed at any portion of the degas process, including the degas process described above or other degas processes known in the art. In preferred embodiments, the pre-release process is performed using an argon or helium plasma which is delivered to the surface of the substrate. The plasma can preferably be delivered after the microwave treatment of the substrate and primary degassing has occurred. The plasma can be delivered while maintaining the chamber or the substrate at a degas temperature.

The integration of microwave radiation into the degas chamber may allow an integrated cure to be performed. After the integrated cure is completed, the wafer may proceed to the pre-metallization clean and metal deposition portions without exposing the wafer to air. Integrated cure can eliminate the need for a stand-alone curing furnace and can further result in semiconductor manufacturing cost savings.

Internal tests have shown that the plasma treatment can result in inert pre-metallization gas adsorption in the polymer. The gas desorbs from the polymer after the plasma is extinguished. However, the gas desorption rate controlled in part by wafer temperature. If the wafer is sufficiently cooled, gas will be trapped in the polymer and will slowly desorb. This "pore-sealing" portion may help reduce polymer film outgassing during the pre-metallization clean portion.

Figure 3:
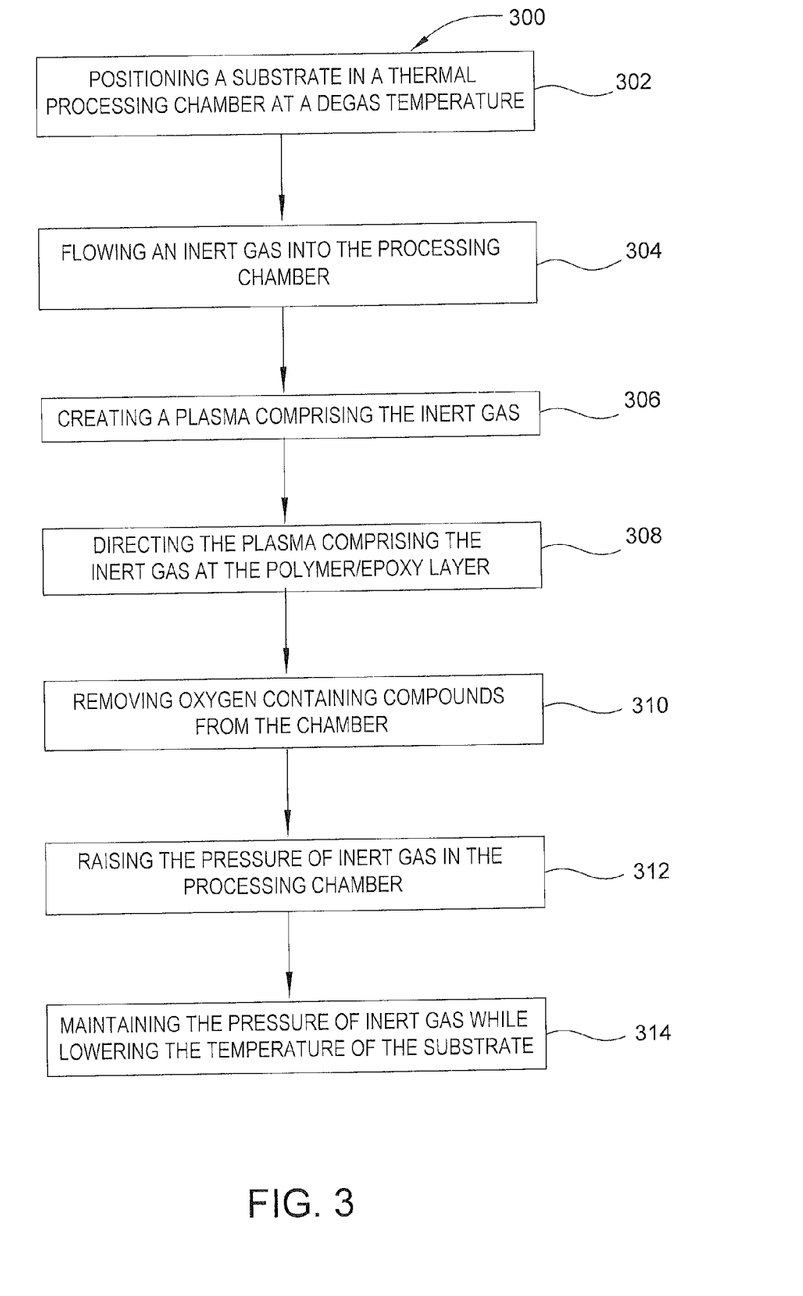
FIG. 3 is a block diagram of the method of degassing according to another embodiment.

FIG. 3 is a method 300 for processing a substrate according to another embodiment. The method 300 can be used either in conjunction with a standard degas process or with the degas process described above. As well, the method 300 can combine elements of the pre-release plasma treatment described above.

The method 300 can include positioning a substrate in a thermal processing chamber at a degas temperature, as in 302. If this embodiment is combined with embodiments described above, the substrate need not be moved. In preferable embodiments, the substrate would be maintained in the same chamber when combining method 300 with method 200. Though not necessary, preferable embodiments would combine one or more elements of method 300 after completion of degassing in method 200.

The method 300 can further include flowing an inert gas into the chamber, as in 304. The inert gas provides a non-reactive atmosphere for the degas process, helps prevent interaction between the desorbed gases and the exposed surfaces, and further can be used to assist in the removal of the desorbed gases. The inert gas flowed into the chamber in this portion can be flowed directly to the chamber, indirectly in connection with a secondary device, such as through a remote plasma device, or any combination thereof. The inert gas used in embodiments of this invention may be any gas which is non-reactive and non-deleterious to the degas or pre-metallization processes, such as a noble gas, for example argon gas or helium.

The method 300 can include creating a plasma comprising an inert gas, as in 306. The plasma can be formed either in the chamber or it may be delivered by a remote plasma source. As discussed previously, the energy source used for the production of the plasma may be any energy source available. The plasma may be inductively coupled, capacitively coupled or microwave plasma. The plasma may be used for both pre-release, as described above, while simultaneously preparing the surface for pore sealing.

The method 300 can further include directing the plasma comprising the inert gas at the polymer/epoxy layer of the substrate, as in 308. It is believed that the treatment with inert gas plasma opens up spaces in the surface of the polymer/epoxy layer in the position where the plasma by-products are released from. These spaces, as well as preexisting spaces, are filled by the activated inert gas which will outgas from the layer in the presence of heat, such as heat from microwave radiation or ambient heat at a degas temperature.

The method 300 can further include removing oxygen containing compounds from the chamber, as in 310. During the plasma treatment, compounds can be released, such as $C_xO_y$ compounds from the polymer/epoxy layer, which will accumulate in the processing area. These compounds can re-adsorb during a cool down process. Embodiments of the present invention can employ a removal method, such as creating a vacuum or purging the chamber with an inert gas flow to remove these compounds from the chamber.

Removing the oxygen containing compounds from the chamber at this portion is less important if the polymer/epoxy layer has been pre-released using a previous inert gas treatment. Thus, the portion of the embodiment in 310 may not be beneficial to one or more embodiments described in the present application, if an equivalent event has already been performed previously in relation to the optional pre-release process.

The method 300 can further include raising the pressure of inert gas in the processing chamber, as in 312. The inert gas can be the gas which was used to purge the chamber in the previous portion. The inert gas can be one or a combination of any previously applicable inert gas, such as argon or helium. The pressure can be raised to a level where voids formed or preexisting in the surface of the polymer/epoxy layer will be at least partially filled by the inert gas. While raising the pressure of inert gas, the substrate should optimally be maintained at a degas temperature. This can be accomplished, among other ways, with standard heating of the substrate as known in the art or the microwave heating embodiments described herein.

The method 300 can include maintaining the pressure of inert gas while lowering the temperature of the substrate, as in 314. When the pressure has reached a desired level for the polymer/epoxy layer, the temperature can be lowered so as to seal the pores with the newly trapped inert gas. The inert gas is believed to displace gasses which might enter during transfer without harmful effects when outgassing during subsequent processing, such as pre-metallization cleaning. The temperature can be lowered by flowing inert gas into the chamber. By removing external sources of heat, a constant flow of inert gas can be used to maintain pressure while lowering the temperature of the substrate. It is desirable to lower the temperature of the substrate below the degas temperature. Further, the temperature can be lowered with a cooling apparatus in the substrate support or in the chamber, as the design of the chamber permits.

Figure 4:
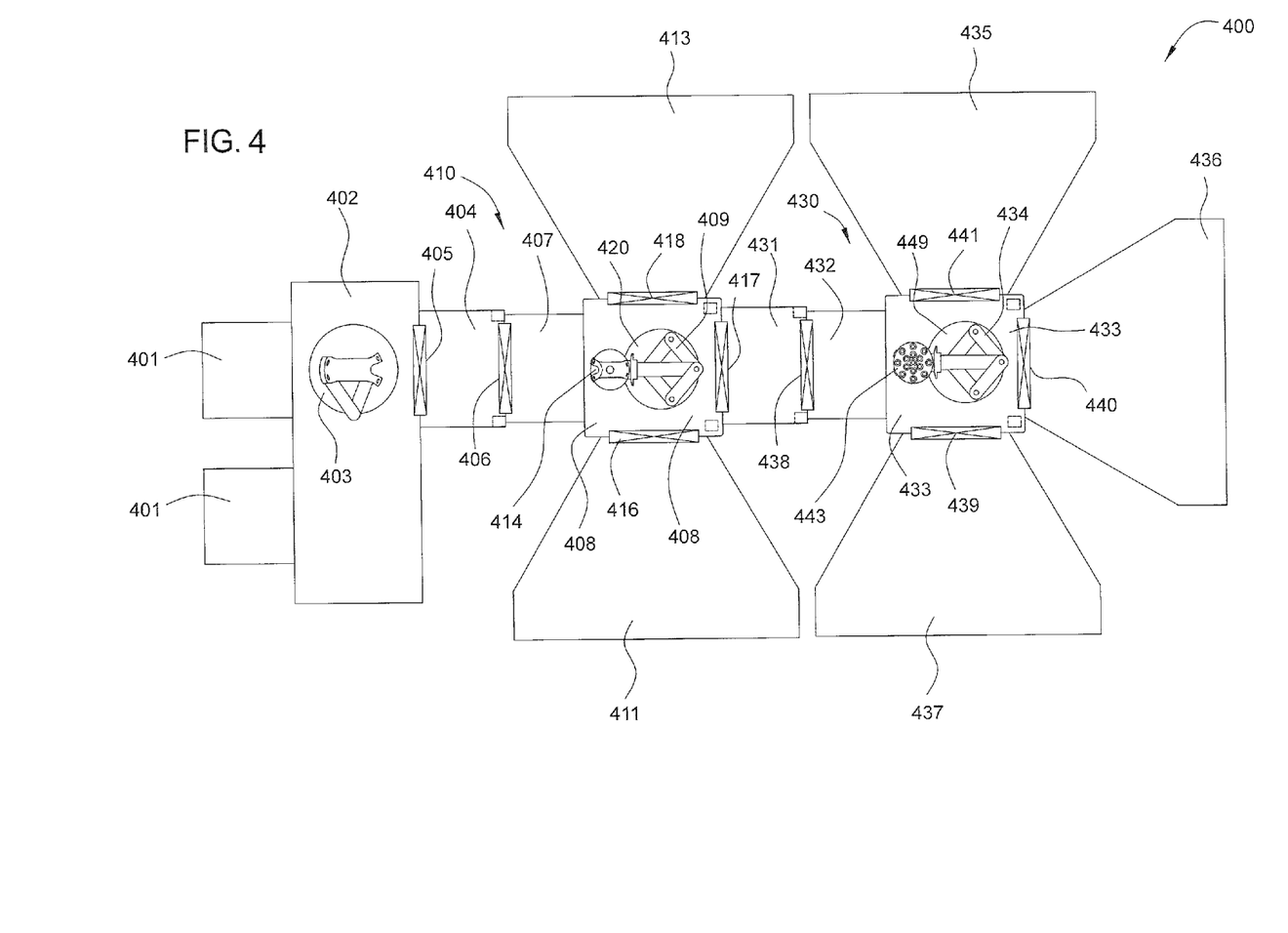
FIG. 4 is a plan view of a vacuum multi-chamber deposition tool in accordance with one embodiment.

FIG. 4 schematically illustrates a plan view of a vacuum multi-chamber deposition tool 400 in accordance with one embodiment of the present invention. The vacuum multi-chamber deposition tool 400 comprises multiple processing chambers coupled to a mainframe comprising two transfer chambers 408 and 433.

The vacuum multi-chamber deposition tool 400 comprises a front-end environment 402 in selective communication with a load lock chamber 404. One or more pods 401 are coupled to the front-end environment 402. The one or more pods 401 are configured to store substrates. A factory interface robot 403 is disposed in the front-end environment 402. The factory interface robot 403 is configured to transfer substrates between the pods 401 and the load lock chamber 404.

The load lock chamber 404 provides a vacuum interface between the front-end environment 402 and a first transfer chamber assembly 410. An internal region of the first transfer chamber assembly 410 is typically maintained at a vacuum condition and provides an intermediate region in which to shuttle substrates from one chamber to another and/or to a load lock chamber.

In one embodiment, the first transfer chamber assembly 410 is divided into two parts. In one embodiment of the present invention, the first transfer chamber assembly 410 comprises a transfer chamber 408 and a vacuum extension chamber 407. The transfer chamber 408 and the vacuum extension chamber 407 are coupled together and in fluid communication with one another. An inner volume of the first transfer chamber assembly 410 is typically maintained at low pressure or vacuum condition during process. The load lock chamber 404 may be connected to the front-end environment 402 and the vacuum extension chamber 407 via slit valves 405 and 406 respectively.

In one embodiment, the transfer chamber 408 may be a polygonal structure having a plurality of sidewalls, a bottom and a lid. The plurality of sidewalls may have openings formed therethrough and are configured to connect with processing chambers, vacuum extension and/or pass through chambers. The transfer chamber 408 shown in FIG. 4 has a square or rectangular shape and is coupled to processing chambers 411, 413, a pass through chamber 431 and the vacuum extension chamber 407. The transfer chamber 408 may be in selective communication with the processing chambers 411, 413, and the pass through chamber 431 via slit valves 416, 418, and 417 respectively.

In one embodiment, a central robot 409 may be mounted in the transfer chamber 408 at a robot port formed on the bottom of the transfer chamber 408. The central robot 409 is disposed in an internal volume 420 of the transfer chamber 408 and is configured to shuttle substrates 414 or substrate carriers 441 among the processing chambers 411, 413, the pass through chamber 431, and the load lock chamber 404. In one embodiment, the central robot 409 may include two blades for holding substrates, each blade mounted on an independently controllable robot arm mounted on the same robot base. In another embodiment, the central robot 409 may have the capacity for vertically moving the blades.

The vacuum extension chamber 407 is configured to provide an interface to a vacuum system to the first transfer chamber assembly 410. In one embodiment, the vacuum extension chamber 407 comprises a bottom, a lid and sidewalls. A pressure modification port may be formed on the bottom of the vacuum extension chamber 407 and is configured to adapt to a vacuuming pump system. Openings are formed on the sidewalls so that the vacuum extension chamber 407 is in fluid communication with the transfer chamber 408, and in selective communication with the load lock chamber 404.

In one embodiment, the vacuum extension chamber 407 comprises a shelf (not shown) configured to store one or more substrates 414. Processing chambers directly or indirectly connected to the transfer chamber 408 may store their substrates on the shelf and use the central robot 409 to transfer them.

The vacuum multi-chamber deposition tool 400 can further comprise a second transfer chamber assembly 430 connected to the first transfer chamber assembly 410 by the pass through chamber 431. In one embodiment, the pass through chamber 431, similar to a load lock chamber, is configured to provide an interface between two processing environments. In this case, the pass through chamber 431 provides a vacuum interface between the first transfer chamber assembly 410 and the second transfer chamber assembly 430.

In one embodiment, the second transfer chamber assembly 430 is divided into two parts to minimize the footprint of the vacuum multi-chamber deposition tool 400. In one embodiment of the present invention, the second transfer chamber assembly 430 comprises a transfer chamber 433 and a vacuum extension chamber 432 in fluid communication with one another. An inner volume of the second transfer chamber assembly 430 is typically maintained at low pressure or vacuum condition during processing. The pass through chamber 431 may be connected to the transfer chamber 408 and the vacuum extension chamber 432 via slit valves 417 and 438 respectively so that the pressure within the transfer chamber 408 may be maintained at different vacuum levels.

In one embodiment, the transfer chamber 433 may be a polygonal structure having a plurality of sidewalls, a bottom and a lid. The plurality of sidewalls may have openings formed therein and are configured to connect with processing chambers, vacuum extension and/or pass through chambers. The transfer chamber 433 shown in FIG. 4 has a square or rectangular shape and is coupled with processing chambers 435, 436, 437, and the vacuum extension chamber 432. The transfer chamber 433 may be in selective communication with the processing chambers 435, 436, via slit valves 441, 440, 439 respectively.

A central robot 434 is mounted in the transfer chamber 433 at a robot port formed on the bottom of the transfer chamber 433. The central robot 434 is disposed in an internal volume 449 of the transfer chamber 433 and is configured to shuttle substrates 414 or substrate carriers 441 among the processing chambers 435, 436, 437, and the pass through chamber 431. In one embodiment, the central robot 434 may include two blades for holding substrates, each blade mounted on an independently controllable robot arm mounted on the same robot base. In another embodiment, the central robot 434 may have the capacity for moving the blades vertically.

In one embodiment, the vacuum extension chamber 432 is configured to provide an interface between a vacuum system and the second transfer chamber assembly 430. In one embodiment, the vacuum extension chamber 432 comprises a bottom, a lid and sidewalls. A pressure modification port may be formed on the bottom of the vacuum extension chamber 432 and is configured to adapt to a vacuum system. Openings are formed through the sidewalls so that the vacuum extension chamber 432 is in fluid communication with the transfer chamber 433, and in selective communication with the pass through chamber 431.

In one embodiment of the present invention, the vacuum extension chamber 432 includes a shelf (not shown), similar to that described in connection with the vacuum extension chamber 407 above. Processing chambers directly or indirectly connected to the transfer chamber 433 may store substrates on the shelf.

A substrate carrier such as the carrier 441 may be used with any processing architecture to enable processing of multiple substrates such as the substrates 443 simultaneously. In one embodiment, the substrate carrier may be a thin sheet of a substantially rigid material capable of withstanding the processing environments created by the processes described herein. The carrier may be a glass or silicon platter in some embodiments. In other embodiments, the carrier may be ceramic or a composite material, such as carbon composite. In some embodiments, the carrier may be a platter coated with a process-resistant material, such as a glass-coated or ceramic-coated platter. The carrier may be a 300 mm substrate commonly used in semiconductor manufacturing processes. In some embodiments, the carrier may be shaped to facilitate substrate processing and handling. For example, the carrier may have raised or lowered portions to facilitate manipulating individual substrates disposed on the carrier. In one embodiment, each substrate site on the carrier may have a trench formed around the site to allow a robot with gripping extensions to contact an edge of a substrate disposed on the site. In another embodiment, the carrier may have a depression formed at the center of the substrate site to allow a robot with gripping extensions to contact an inner edge of the substrate having a central opening. In some embodiments, the substrate sites on the carrier may be depressed to prevent substrates from moving on the carrier as the carrier is transported.

Typically, substrates are processed in a sealed chamber having a pedestal for supporting a substrate disposed thereon. The pedestal may include a substrate support that has electrodes disposed therein to electrostatically hold the substrate against the substrate support during processing. For processes tolerant of higher chamber pressures, the pedestal may alternately include a substrate support having openings in communication with a vacuum source for securely holding a substrate against the substrate support during processing.

Processes that may be performed in any of the chambers 411, 413, 435, 436, or 437, include deposition, implant, and thermal treatment processes, among others. In one embodiment, a chamber such as any of the chambers 411, 413, 435, 436, or 437, is configured to perform a sputtering process on a substrate, or on multiple substrates simultaneously. In another embodiment, chamber 411 is a degas chamber as described with reference to FIG. 1. In a further embodiment, the chamber 413 is a pre-metallization clean chamber. The pre-metallization clean chamber of this embodiment uses a sputtering clean process comprising an inert gas, such as argon. In further embodiments, the chamber 435 is a deposition chamber. The deposition chamber used with embodiments described here can be any known deposition chamber.

Embodiments described herein relate to methods and apparatus for degassing a substrate. The use of microwave radiation can allow for a lower temperature and higher throughput degassing procedure than can be achieved from standard thermal degassing units. Further, microwave degassing embodiments can include both curing and degassing in a single chamber. Further, it has been found that gases available to the metallization include both accumulated gases, such as $H_2O$, and produced gases, such as gases which occur after plasma treatment of the polymer/epoxy layer. By employing a pre-release stage, a pore sealing stage or combinations thereof as part of the degassing of the substrate, both accumulated gases and produced gases may be removed from the substrate prior to pre-metallization clean. Degassing as disclosed above is believed to lead to higher quality metal features during subsequent deposition.

While the foregoing is directed to embodiments of the present invention, other and further embodiments of the invention may be devised without departing from the basic scope thereof, and the scope thereof is determined by the claims that follow.

The invention claimed is:

1. A method for degassing a substrate, sequentially comprising:
   positioning a substrate comprising a polymer or an epoxy within a processing chamber;
   maintaining the chamber between a degas temperature and a glass transition temperature;
   flowing an inert gas into the chamber;
   creating a plasma comprising the inert gas;
   exposing the substrate to a plasma comprising the inert gas;
   removing oxygen containing compounds from the chamber;
   raising the pressure of inert gas in the chamber; and
   maintaining the pressure of inert gas while cooling the substrate to a temperature lower than the degas temperature.

2. The method of claim 1, wherein the inert gas is argon or helium.

3. The method of claim 1, wherein the substrate is maintained at a temperature between the degas temperature and the glass transition temperature from positioning the substrate in the processing chamber until oxygen containing compounds have been removed from the chamber.

4. The method of claim 1, further comprising delivering variable frequency microwave radiation to the substrate prior to flowing an inert gas into the chamber.

5. The method of claim 4, wherein the frequency of the variable frequency microwave radiation varies within the ranges from 5.85 GHz to 7.0 GHz.

6. A method for degassing a substrate, sequentially comprising:
   positioning a substrate comprising a polymer or an epoxy within a processing chamber;
   directing a variable frequency microwave radiation source to deliver microwave radiation to the substrate;

delivering microwave radiation to the substrate at a frequency which changes over short bursts of time while maintaining the temperature of the substrate at a degas temperature; and removing a first set of oxygen containing compounds from the chamber.

7. The method of claim 6, further comprising:
flowing an inert gas into the chamber;
creating a plasma comprising the inert gas;
exposing the substrate to a plasma comprising the inert gas;
removing a second set of oxygen containing compounds from the chamber;
raising the pressure of inert gas in the chamber; and
maintaining the pressure of inert gas while cooling the substrate to a temperature lower than the degas temperature.

8. The method of claim 6, wherein the short bursts of time are from 20 microseconds to 30 microseconds.

9. The method of claim 8, wherein the substrate is maintained at a temperature between the degas temperature and the glass transition temperature from positioning the substrate in the processing chamber until the second set of oxygen containing compounds have been removed from the chamber.

10. A vacuum multi-chamber deposition tool comprising:
a load lock chamber;
a first transfer chamber with a first central robot mounted therein;
a second transfer chamber with a second central robot mounted therein;
a degas chamber comprising:
  a chamber body;
  a substrate support configured to support a substrate having a selected diameter;
  a substrate heating mechanism configured to heat the substrate;
  a temperature measuring device; and
  a variable frequency microwave radiation source using two or more frequencies selected from the range of 5.85 GHz to 7.0 GHz which vary by between 200 Hz and 280 Hz and configured to deliver the microwave radiation of varying frequency toward the surface of the substrate support;
a pre-metallization clean chamber fluidly connected with the degas chamber and employing a sputtering clean process comprising an inert gas; and
a deposition chamber fluidly connected with the pre-metallization clean chamber.

* * * * *